(12) United States Patent
Yokoyama et al.

(10) Patent No.: US 6,479,407 B2
(45) Date of Patent: Nov. 12, 2002

(54) SEMICONDUCTOR DEVICE AND PROCESS FOR PRODUCING THE SAME

(75) Inventors: Takashi Yokoyama; Tatsuya Usami, both of Tokyo (JP)

(73) Assignee: NEC Corporation (JP)

( * ) Notice: Subject to any disclaimer, the term of this patent is extended or adjusted under 35 U.S.C. 154(b) by 64 days.

(21) Appl. No.: 09/770,114

(22) Filed: Jan. 23, 2001

(65) Prior Publication Data

US 2001/0019857 A1 Sep. 6, 2001

Related U.S. Application Data

(62) Division of application No. 09/366,517, filed on Aug. 3, 1999, now Pat. No. 6,255,732.

(30) Foreign Application Priority Data

Aug. 14, 1998 (JP) .............................. 10-229708

(51) Int. Cl.$^7$ ................................ H01L 21/31
(52) U.S. Cl. ................. 438/788; 438/789; 438/790
(58) Field of Search ................. 438/778, 780, 438/787, 788, 789, 790, 792, 793, 794

(56) References Cited

U.S. PATENT DOCUMENTS 5,723,909 A  *  3/1998  Yano et al. ............... 257/760
6,200,912 B1  *  3/2001  Aoi ........................... 438/780
6,245,690 B1  *  6/2001  Yau et al. .................. 438/780

FOREIGN PATENT DOCUMENTS

| JP | 7176613    | * | 7/1995  |
| JP | H7-221085  | * | 8/1995  |
| JP | H7-231039  | * | 8/1995  |
| JP | 8107144    | * | 4/1996  |
| JP | 8111458    | * | 4/1996  |
| JP | H10-150036 | * | 6/1998  |
| JP | H10-173047 | * | 6/1998  |
| JP | H11-87332  | * | 3/1999  |
| JP | H11-297829 | * | 10/1999 |

* cited by examiner

*Primary Examiner*—Kevin M. Picardat
(74) *Attorney, Agent, or Firm*—Hayes Soloway PC

(57) ABSTRACT

An interlayer insulation film containing a dielectric component represented by a chemical formula having a Si—E bond or a Si—CH$_3$ bond is formed on a substrate. Next, a photoresist is formed on the interlayer insulation film. The photoresist is then formed into a form of a contact hole. Thereafter, dry-etching of the interlayer insulation film is conducted by use of the photoresist as a mask. Subsequently, the photoresist is removed, and the interlayer insulation film is exposed to nitrogen plasma and hydrogen plasma, for example.

10 Claims, 9 Drawing Sheets

SEMICONDUCTOR DEVICE AND PROCESS FOR PRODUCING THE SAME

This application is a divisional of U.S. Ser. No. 09/366,517, filed on Aug. 3, 1999, now U.S. Pat. No. 6,255,732.

BACKGROUND OF THE INVENTION

1. Field of the Invention

The present invention relates to a semiconductor device having an interlayer insulation film the required properties of which are liable to deteriorate by oxygen plasma treatment, and a process for producing the same. In particular, the present invention relates to a semiconductor device making it possible to restore deteriorated properties, and a process for producing the same.

2. Description of the Related Art

The demand for high-speed processing of signals in large scale integrated circuits (LSIs) has been increasing year by year. The speed of processing signals in LSIs is mainly decided by the operation speed of their transistors themselves and the delay time of signal-transmission in wiring. The operation speed of transistors, which has greatly influenced the speed of processing signals in the prior art, has been improved by scaling down the size of the transistors.

In LSIs having a designed size of less than 0.25 $\mu$m, however, a decline in the signal-processing speed based on the delay in signal-transmission in wiring is becoming remarkable. Such an influence is high in LSI devices having a multilayer wiring structure wherein the number of wiring layers is over 4.

Recently, therefore, as a method for improving the delay in signal-transmission in wiring, there has been investigated a method of using, instead of an interlayer insulation film of conventional silicon oxide films, a hydrogen silsesquioxane (HSQ) film or the like, which has a smaller dielectric constant. The HSQ film is a resin film having a chemical structure wherein a part of Si—O bonds of a silicon oxide film is replaced by Si—H bonds. The film is applied onto a substrate and then heated and sintered so as to be used as an interlayer insulation film. Since almost all parts of the HSQ film are composed of Si—O bonds in the sane way as in conventional silicon oxide films, the HSQ film has a low dielectric constant and heat-resistance, up to about 500° C.

However, when the HSQ film is used as an interlayer insulation film, there remains a problem that the HSQ film deteriorates in the step of exfoliating photoresist used for forming various patterns in usual lithographic technique and etching technique.

Generally, in the step of exfoliating photoresist, a treatment with oxygen plasma is conducted and subsequently remnants of the photoresist, which are not exfoliated, and etching remnants are removed. For this purpose, treatment with a wet exfoliating solution containing monoethanolamine or the like is conducted. When the HSQ film is exposed to oxygen plasma, Si—H bonds therein are broken and Si—OH bonds are generated so that the film comes to contain water. When the HSQ film is treated with the wet exfoliating solution, Si—H bonds are broken and Si—OH bonds are generated in the same way as in the treatment with oxygen plasma. That is, in these exfoliating steps, the HSQ film comes to contain a large amount of water. As a result, its dielectric constant unfavorably rises. If the HSQ film comes to contain a large amount of water, there arise a problem of leakage between vias. In the step of embedding in via holes by CVD or sputtering, the embedding in the via holes becomes insufficient by degassing.

The following will describe a process for producing a semiconductor device in the prior art. FIG. 1 is a cross section illustrating the semiconductor device producing process in the prior art.

An underlying layer 52 is first formed on a silicon substrate 51. The underlying layer 52 includes underlying layer elements such as transistors. Next, a barrier metal layer 53 is selectively formed on the underlying layer 52. Thereafter, a first metal wiring layer 54 is formed on the barrier metal layer 53. A reflection preventive layer 55 is formed on the first metal wiring layer 54. Next, a first silicon oxide film 57 is formed on the entire surface by plasma CVD. Subsequently, an HSQ film 58 is applied on the first silicon oxide film 57 by a coating machine. The resultant is subjected to provisional sintering on a hot plate, followed by sintering in a sintering furnace.

At this time, in order to prevent dissociation of Si—H bonds, nitrogen or the like is generally introduced into the space around the hot plate or in the sintering furnace so that the HSQ film does not react with oxygen or water. Next, a second silicon oxide film 59 is formed on the HSQ film 58 by plasma CVD or the like. Thereafter, a patterned photoresist is used to etch the second silicon oxide film 59 and the HSQ film 58 on the reflection preventive layer 55. In this way, via holes are made. Next, the photoresist is exfoliated by a treatment with oxygen plasma. The resultant is further subjected to an exfoliating treatment with an alkali-wet solution in order to remove etching remnants and the like.

As described above, at this time Si—H bonds in the regions of the HSQ film 58 which are exposed to the via holes and subjected to the oxygen plasma are changed into Si—OH bonds by the oxygen plasma treatment and the exfoliating treatment with the wet solution. Therefore, deteriorated portions 58b having an increased dielectric constant are produced in these regions. These deteriorated portions 58b cause poisoned vias.

Moreover, there is proposed a method of forming an HSQ film and subsequently subjecting the resultant to a plasma treatment with an inert gas, such as nitrogen or argon, from its surface in order to improve the strength of the HSQ film (Japanese Patent Application Laid-Open No. 8-111458).

According to this producing process in the prior art, disclosed in the above-mentioned publication, the strength of the HSQ film is improved. Thus, cracks are not easily produced even if external stress is applied to the HSQ film from a metal layer formed as an underlying layer of the HSQ film. Even by this method in the prior art, however, it is impossible to suppress the rise in the dielectric constant of the HSQ film.

SUMMARY OF THE INVENTION

An object of the present invention is to provide a semiconductor device making it possible to reduce the dielectric constant of an interlayer insulation film raised by oxygen plasma treatment or the like; and a process for producing the same.

According to one aspect of the present invention, a semiconductor device may comprise a semiconductor substrate, a wiring layer formed on the semiconductor substrate, a nitride film which covers the wiring layer, and an interlayer insulation film formed on the nitride film. The interlayer insulating film may have an opening reaching the wiring layer and containing a dielectric component represented by a chemical formula having a Si—H bond or a Si—CH$_3$ bond.

In the aspect of this present invention, the wiring layer is covered with the nitride film. Therefore, even if a fluorine plasma treatment is conducted to lower the dielectric constant of the interlayer insulation film raised by oxygen plasma treatment in the process for producing the semiconductor device, the wiring layer is shut off from the fluorine plasma. Thus, the wiring layer is not corroded by the fluorine plasma, to obtain the interlayer insulation film having a low dielectric constant. By the reduction in the dielectric constant of the interlayer insulation film, it is possible to operate a semiconductor integrated circuit such as LSI at a high speed.

The nitride film may be made of titanium nitride or silicon nitride.

According to one aspect of the present invention, a process for producing a semiconductor device may comprise the steps of forming an interlayer insulation film containing a dielectric component represented by a chemical formula having a Si—H bond or a Si—CH$_3$ bond on a semiconductor substrate, forming a photoresist on the interlayer insulation film, patterning the photoresist into a form of a contact hole, conducting dry-etching of the interlayer insulation film by use of the photoresist as a mask, removing the photoresist, and exposing the interlayer insulation film to nitrogen plasma and hydrogen plasma.

The step of exposing the interlayer insulation film to nitrogen plasma and hydrogen plasma may comprise the step of introducing nitrogen gas and hydrogen gas in a chamber in which the semiconductor substrate is arranged, and the volume of the hydrogen gas to the volume of the nitrogen gas may be from 2 to 80%.

According to another aspect of the present invention, process for producing a semiconductor device may comprise the steps of forming an interlayer insulation film containing a dielectric component represented by a chemical formula having a Si—H bond or a Si—CH$_3$ bond on a semiconductor substrate, forming a photoresist on the interlayer insulation film, patterning the photoresist into a form of a contact hole, conducting dry-etching of the interlayer insulation film by use of the photoresist as a mask, removing the photoresist, and exposing the interlayer insulation film to fluorine plasma or hexamethyldisilaxane gas.

According to another aspect of the present invention, a process for producing a semiconductor device may comprise the steps of forming a wiring layer selectively on a semiconductor substrate, forming a nitride film on the entire surface, forming an interlayer insulation film containing a dielectric component represented by a chemical formula having a Si—H bond or a Si—CH$_3$ bond on the nitride film, forming a photoresist on the interlayer insulation film, patterning the photoresist into a shape having an opening on the wiring layer, conducting of dry-etching of the interlayer insulation film by use of the photoresist as a mask, removing the photoresist, and exposing the interlayer insulation film to fluorine plasma.

In the process for the present invention, even if the dielectric constant of the interlayer insulation film is raised at the time of removing the photoresist, the interlayer insulation film is subsequently exposed to the predetermined kind of plasma or hexamethyldisilaxane gas. Therefore, the raised dielectric constant can be sufficiently lowered. As a result, a semiconductor integrated circuit such as LSI can be operated at a high speed by the drop in the dielectric constant of the interlayer insulation film.

According to the present invention, even it the fluorine plasma treatment is conducted to lower the dielectric constant of the interlayer insulation film which is raised by the oxygen plasma treatment in the process for producing the device, the wiring layer is not exposed to the fluorine plasma and is not corroded.

DESCRIPTION OF THE PREFERRED EMBODIMENTS

Figure 1:
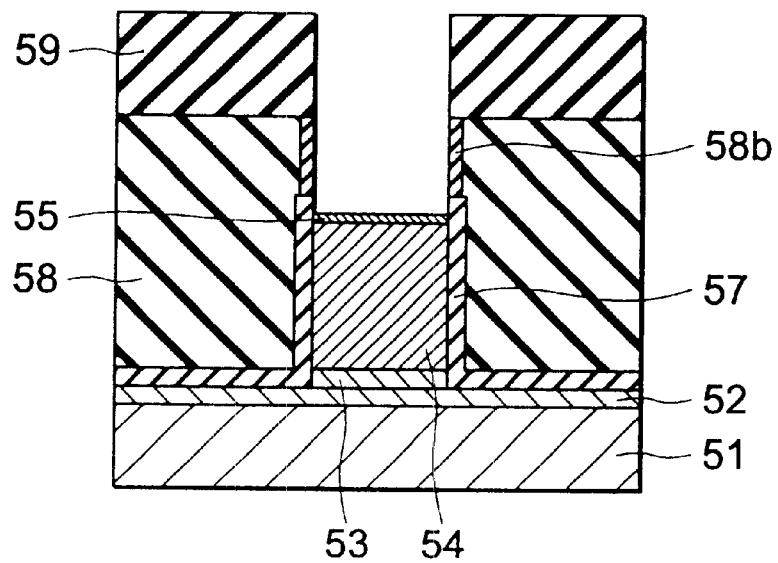
FIG. 1 is a cross section illustrating a process for producing a semiconductor device in the prior art.
Figure 2:
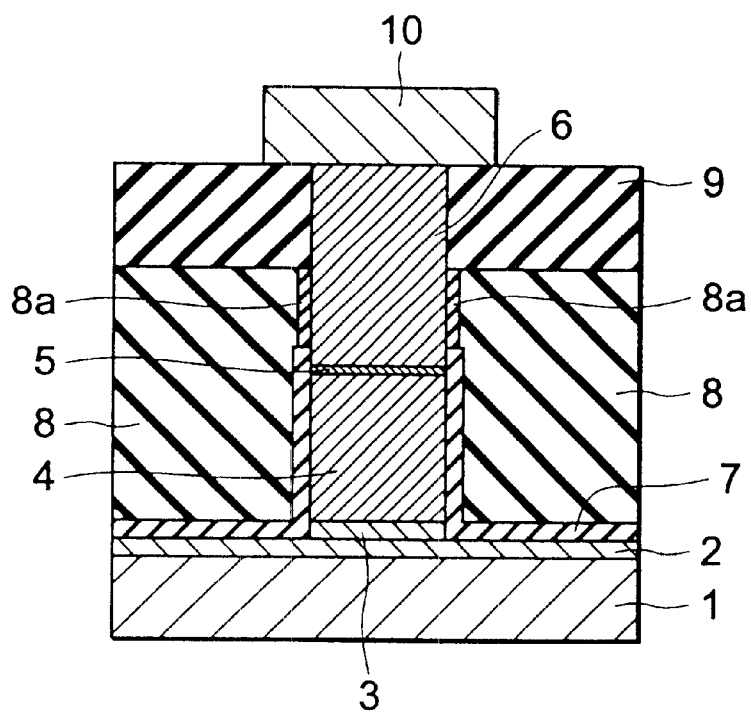
FIG. 2 is a cross section illustrating a semiconductor device according to a first embodiment of the present invention.

Referring to the attached drawings, semiconductor devices according to embodiments of the present invention will be specifically described hereinafter. FIG. 2 is a cross section illustrating a semiconductor device according to a first embodiment of the present invention.

In the present embodiments an underlying layer 2 is formed on a silicon substrate 2. A barrier metal layer 3 is selectively formed on the underlying layer 2. A first metal wiring layer 4 is formed on the barrier metal layer 3. A reflection preventive layer 5 is formed on the first metal wiring layer 4. A connecting metal layer 6 is formed on the reflection preventive layer 5.

A first interlayer insulation film 7 is formed to cover the upper face of the underlying layer 2, and the side faces of the barrier metal 3, the metal wiring layer 4 and the reflection preventive layer 5. A second interlayer insulation film 8 is formed on the first interlayer insulation film 7, so as to have a thickness up to the middle of the connecting metal layer 6. The permittivity of the second interlayer insulation film 8 is smaller than that of silicon oxide films. A modified portion 8a is formed at the interface between the second interlayer insulation film 8 and the connecting metal layer 6. A third interlayer insulation film 9 is formed on the second interlayer insulation film 8, so as to have a height up to the upper end of the connecting metal layer 6. A second metal wiring layer 10 is formed on the connecting metal layer 6, so as to spread on a part of the third interlayer insulation film 9.

The first metal wiring layer 4 and the second metal wiring layer 10 are, for example, made of an aluminum-based wiring material, such as Al alloy containing Cu, or Al alloy containing Si and Cu. The barrier metal layer 3 and the reflection preventive layer 5 are, for example, made of Ti, TiN or TiW. The first interlayer insulation film 7 and the third interlayer insulation film 9 are, for example, made of SiH$_4$-type plasma SiO$_2$; TEOS (tetraethylorthosilicate)-type plasma SiO$_2$, using Si(OC$_2$H$_5$)$_4$ as a raw material; SiH$_4$-type plasma SiON; SiH$_4$-type plasma SiN, plasma SiOF containing fluorine; or the like. The second interlayer insulation film 8 is, for example, made of hydrogen silsesquioxane (HSQ) or organic spin-on glass (SOG). Almost all of bonds in the second interlayer insulation film 8 are Si—O bonds, but almost all of bonds in the modified portion 8a are Si—H bonds and Si—N bonds. The connecting metal layer 6 is, for example, made of tungsten, aluminum or the like. The barrier metal thereof is, for example, made of TiN or Ti.

The following will describe a process for producing the above-mentioned semiconductor device according to the first embodiment of the present invention. FIGS. 3A to 3E are cross sections illustrating the process for producing the semiconductor device according to the first embodiment, in the order of the steps thereof.

Figure 3A:
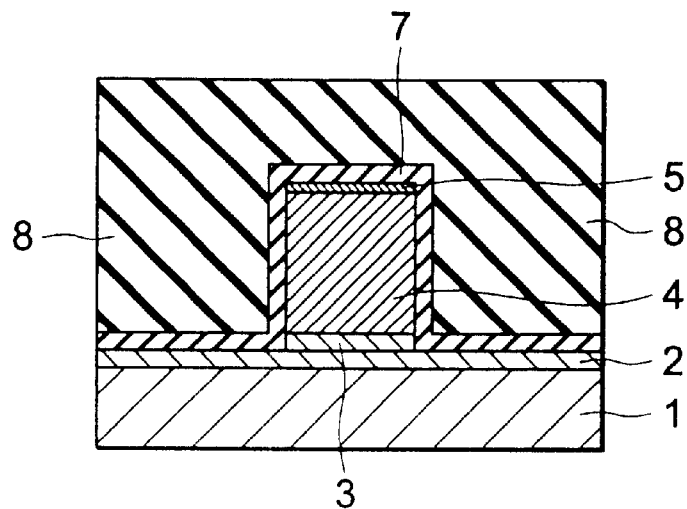
FIGS. 3A to 3E are cross sections illustrating a process for producing the semiconductor device according to the first embodiment of the present invention, in the order of the steps thereof.

As shown in FIG. 3A, the underlying layer 2 is first formed on the silicon substrate 1. The underlying layer 2 includes underlying layer elements such as transistors. Next, for the connection to the underlying layer elements, the barrier metal layer 3 made of TiN/Ti or the like is selectively formed on the underlying layer 2, to have a thickness of 30 to 200 nm, for example. Thereafter, the first metal wiring layer 4 made of Al or Al-alloy containing Cu is formed by sputtering on the barrier metal layer 3, to have a thickness of 300 to 800 nm, for example. Furthermore, for the prevention of reflection in lithography, the reflection preventive layer 5 made of TiN or the like is formed on the first metal wiring layer 4, to have a thickness of 10 to 100 nm, for example. Next, the first interlayer insulation film 7 made of silicon oxide or fluorine-containing silicon oxide is formed on the entire surface in a conformal way along a pattern by plasma CVD (Chemical Vapor Deposition) or the like. The thickness of the film 7 is made up to 20 to 100 nm, for example. The adhesion between the second interlayer insulation film 8, which will be subsequently formed, and the substrate 1 is improved by the first interlayer insulation film 7. The thickness thereof is preferably as thin as possible to reduce the dielectric constant of the whole of the interlayer insulation films.

Subsequently, the HSQ resin film is applied on the first interlayer insulation film 7, to have a thickness of 200 to 1000 nm, for example. For provisional sintering, the resultant is subjected to a 3-step heating treatment under temperature conditions, for example, of 100 to 150° C., 150 to 250° C., and 250 to 300° C., each of which is held for 1–10 minutes, in an atmosphere of nitrogen. The substrate 1 having the HSQ resin film subjected to the provisional sintering is put into a sintering furnace, and then sintered at 350 to 500° C. in an atmosphere of nitrogen for about 1 hour, for example. In that manner, the second interlayer insulation film 8 is formed.

Figure 3B:
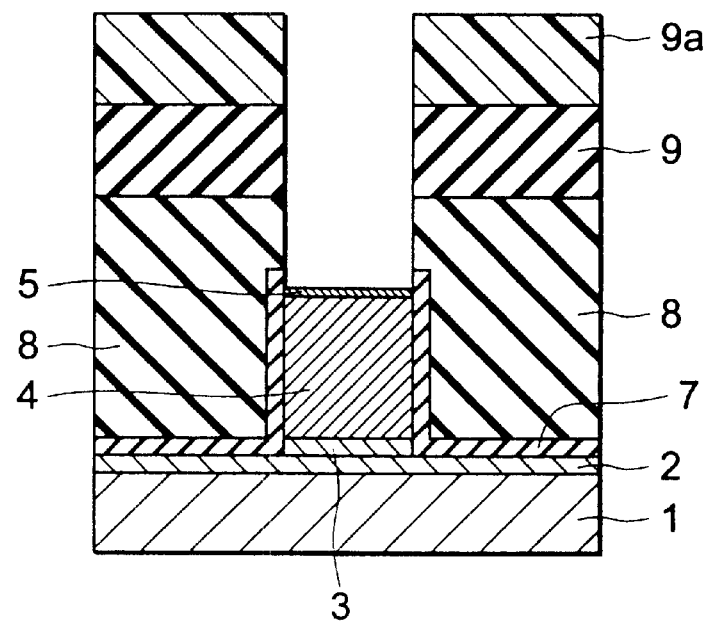

Next, as shown in FIG. 3B, the third interlayer insulation film 9 made of silicon oxide or the like is formed on the second interlayer insulation film 8, to have a thickness of 2000 to 15000 nm, for example. Thereafter, a patterned photoresist 9a is formed on the third interlayer insulation film 9, to have a thickness of about 1 μm, for example. The photoresist 9a is used to form via holes reaching the reflection preventive layer 5.

Figure 3C:
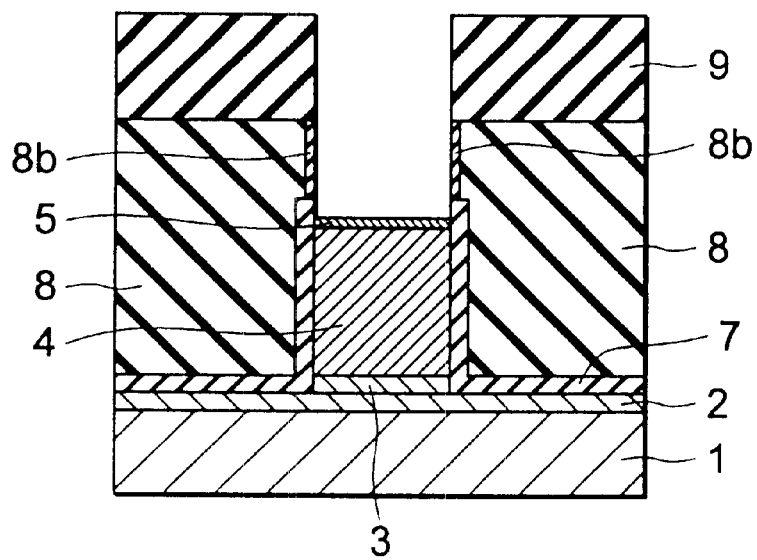

Next, as shown in FIG. 3C, the resultant is subjected to an oxygen plasma treatment at the output of 300 to 600 W and at an oxygen-introduced flow of 100 to 400 sccm for 1 to 5 minutes, for example, in a chamber of a plasma-treating machine, so as to exfoliate the photoresist 9a. In order to remove the remnants of the photoresist 9a which is not exfoliated and etching remnants, the resultant is subjected to a wet exfoliating treatment with a wet exfoliating solution containing ethanolamine or the like for 10 to 20 minutes, for example. By these oxygen plasma treatment and wet exfoliating treatment, Si—H bonds in the regions exposed to the via holes of the second interlayer insulation film 8 are broken and Si—OH bonds are produced to generate the deteriorated portions 8b in these regions.

Figure 3D:
Figure 3D:
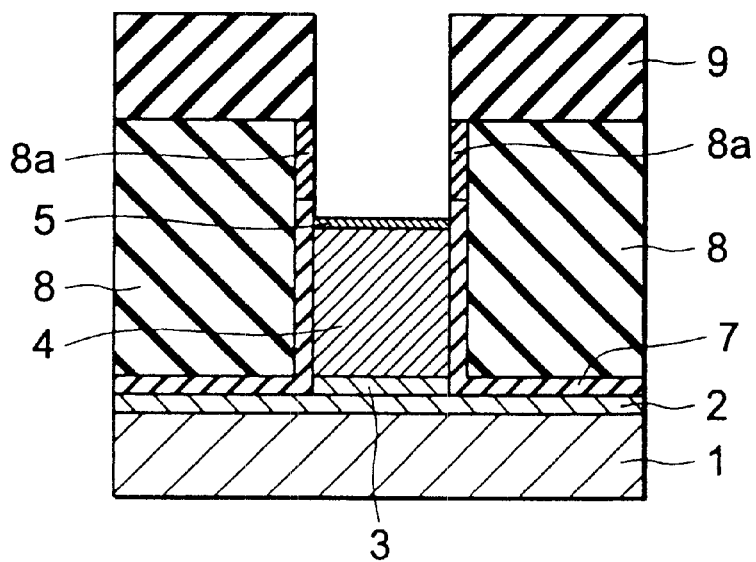

Next, the substrate 1 is introduced into the chamber of the plasma treating machine and, as shown in FIG. 3D, the substrate 1 is then exposed to nitrogen plasma and hydrogen plasma at the same time. These plasmas are generated by setting the temperature inside the chamber to 50 to 300° C., for example, and using a parallel-plate type reactor, inductively coupled radio frequency plasma (ICP), a helicon, electron cyclotron resonance (ECR), a microwave-generating source, or the like at an output of 500 to 1500 W, for example. The flows of nitrogen gas and hydrogen gas introduced into the chamber is from 100 to 1000 sccm and from 20 to 800 sccm, for example, respectively. The blend ratio of the hydrogen gas to the nitrogen gas is preferably set up to from 2 to 80%. In this manner, Si—OH bonds in the deteriorated portions 8b are replaced by Si—N bonds or Si—H bonds so that the deterioration of the film quality is restored. Thus, the modified portion 8a is generated in the regions where the deteriorated portion 8b has been formed. Therefore, the film quality of the surface of the HSQ film is recovered. However, if the blend ratio of the hydrogen gas to the nitrogen gas is less than 2%, a complete nitride film tends to be generated so that the dielectric constant of the HSQ film may unfavorably rise. On the other hand, if the above-mentioned blend ratio is more 80%, whisker and the like may be generated in the first wiring layer 4 made mainly of aluminum. Therefore, this blend ratio is preferably from 2 to 80%.

Figure 3E:
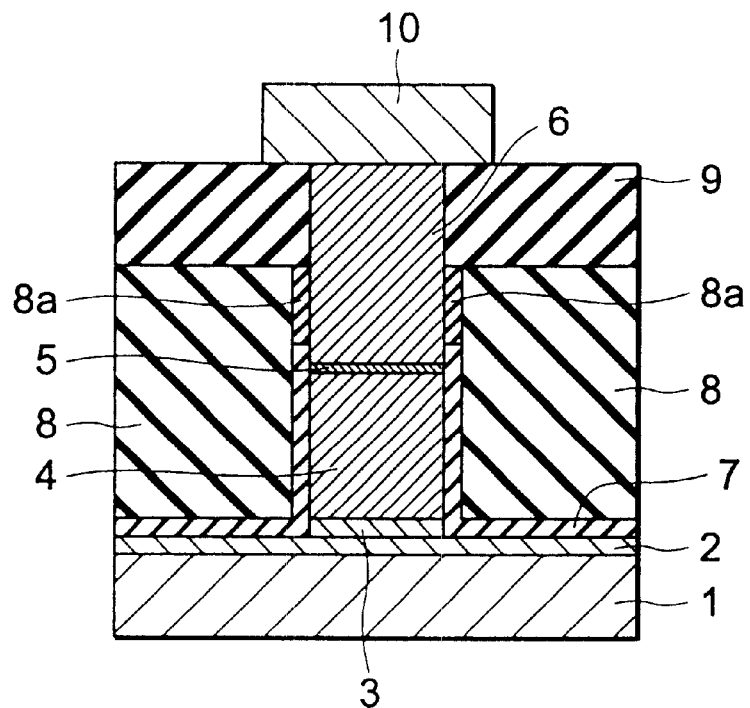

Next, as shown in FIG. 3E, the connecting metal layer 6 made of tungsten, aluminum or the like is embedded in the via holes by CVD or sputtering. The second wiring layer 10 is selectively formed on a part of the third interlayer insulation film and on the connecting metal layer 6.

In the first embodiment thus produced, the modified portions 8a, the film-quality-deterioration of which is restored, are formed by subjecting the deteriorated portions 8b formed in the step of exfoliating the photoresist 9a to nitrogen plasma treatment and hydrogen plasma treatment simultaneously. In this manner, it is possible to prevent an increase in the electric constant of the second interlayer insulation film 8 containing, for example, the HSQ film. It is also possible to prevent the inferiority in embedding tungsten, aluminum or the like in the via holes and overcome the problem of leakage between the vias.

Figure 4:
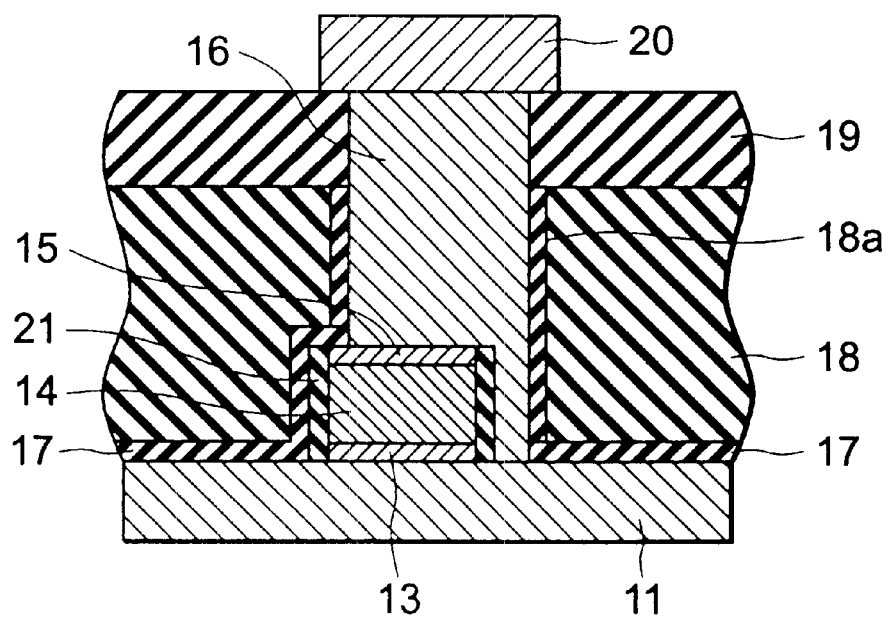
FIG. 4 is a cross section illustrating a semiconductor device according to a second embodiment of the present invention.

The following will describe a second embodiment of the present invention. FIG. 4 is a cross section illustrating a semiconductor device according to the second embodiment of the present invention.

In the present embodiment, an underlying layer (not shown) is formed on a silicon substrate 11. A barrier metal layer 13 is selectively formed on the underlying layer. A first metal wiring layer 14 is formed on the barrier metal layer 13. A reflection preventive layer 15 is formed on the first metal layer 14.

A fluorine preventive layer 21 is formed to cover the side face of the barrier metal layer 13, the metal wiring layer 14 and the reflection preventive layer 15. A connecting metal layer 16 is formed on a part of the surface of the reflection preventive layer 15 in such a manner that the layer 16 has a region reaching the underlying layer from the surface of the fluorine preventive layer 21. A first interlayer insulation film 17 is formed to cover the side face of the fluorine preventive layer 21 not covered with the connecting metal layer 16 or the like, the surface of the underlying layer, and a part of the surface of the reflection preventive layer 15. A second interlayer insulation film 18 is formed on the first interlayer insulation film 17, so as to have a thickness up to the middle of the connecting metal layer 16. The permittivity of the second interlayer insulation film 18 is smaller than that of silicon oxide films. A modified portion 18a is formed at the interface between the second interlayer insulation film 18 and the connecting metal layer 16. A third interlayer insulation film 19 is formed on the second interlayer insulation film 18, so as to have a height up to the upper end of the connecting metal layer 16. A second metal wiring layer 20 is formed on the connecting metal layer 16, so as to spread on a part of the third interlayar insulation film 19.

The first metal wiring layer 14 and the second metal wiring layer 20 are, for example, made of an aluminum-based wiring material, such as Al alloy containing Cu, or Al alloy containing Si and Cu. The barrier metal layer 13 and the reflection preventive layer 15 are, for example, made of Ti, TiN or TiW. The first interlayer insulation film 17 and the third interlayer insulation film 19 are, for example, made of $SiH_4$-type plasma $SiO_2$; TEOS-type plasma $SiO_2$, using $Si(OC_2H_5)_4$ as a raw material; $SiH_4$-type plasma SiON; $SiH_4$-type plasma SiN; plasma SiOF containing fluorine; or the like. The second interlayer insulation film 18 is, for example, made of HSQ or organic SOG. The modified portion 18a of the second insulation film 18 is, for example, made of an oxide film having Si—F bonds. The connecting metal layer 16 is, for example, made of tungsten, aluminum or the like. The barrier metal is, for example, made of TiN or Ti.

Figure 5A:
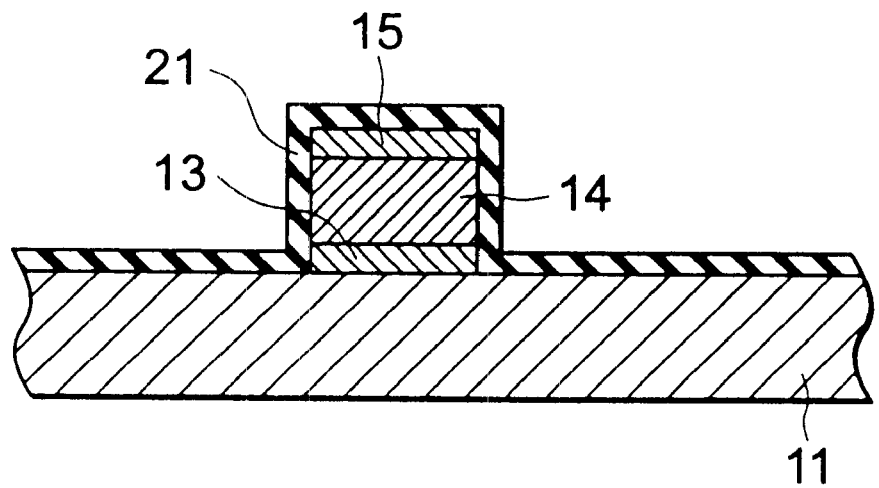
FIGS. 5A to 5C are cross sections illustrating a process for producing the semiconductor device according to the second embodiment of the present invention, in the order of the steps thereof.
Figure 5B:
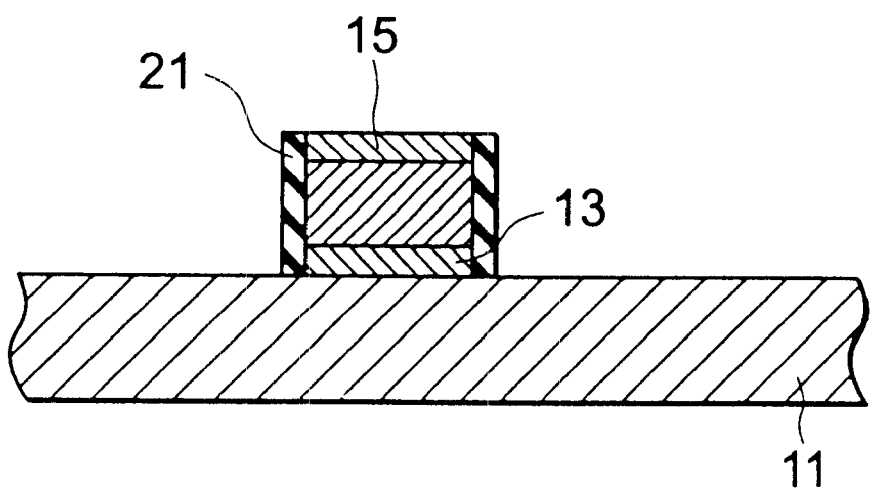
Figure 5C:
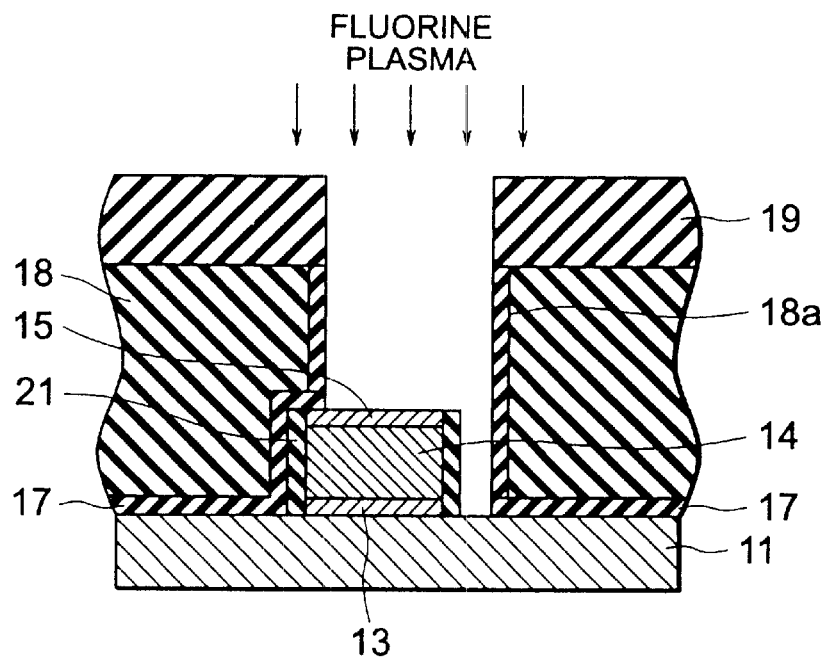

The following will describe a process for producing the semiconductor device according to the second embodiment of the present invention. FIGS. 5A to 5C are cross sections illustrating the process for producing the semiconductor device according to the second embodiment, in the order of the steps thereof.

As shown in FIG. 5A, the underlying layer (not shown) is first formed on the silicon substrate 11. The underlying layer includes underlying layer elements such as transistors. Next, for the connection to the underlying layer elements and the like, the barrier metal layer 13 is selectively formed on the underlying layer. Thereafter, the first metal wiring layer 14 is formed on the barrier metal layer 13. Furthermore, the reflection preventive layer 15 made of TiN, for example, is formed on the first metal wiring layer 14, to have a thickness of 50 nm or more. Next, the fluorine preventive layer 21 is formed on the entire surface in a conformal way by CVD, for example, to have a thickness of 50 to 100 nm.

Next, as shown in FIG. 5B, the fluorine preventive layer 21 is etched under anisotropic, low-pressure and high-density plasma conditions until the reflection preventive layer 15 makes its appearance. Since the regions formed on the side faces of the first metal wiring layer 14 and the like are not easily etched at this time, the fluorine preventive layer 21 remains on these regions. This makes it possible to obtain a structure wherein the first wiring layer 14 is covered with the fluorine preventive layer 14 made of TiN, for example, and the reflection preventive layer 15.

Next, as shown in FIG. 5C, the first interlayer insulation film 17 is deposited on the entire surface in a conformal manner along the pattern. Thereafter, the HSQ resin film is applied on the first interlayer insulation film 17. The resultant is subjected to a thermal treatment in the same manner as in the first embodiment to form the second interlayer insulation film 18. The third interlayer insulation film 19 made of silicon oxide, for example, is then deposited in the same manner as in the first embodiment, and the border-less contact connecting manner, by which a gap is generated between the wiring and via holes, is used to form the via holes.

In the second embodiment, the side face of the first wiring layer 14 is covered with the fluorine preventive layer 21 made of TiN, for example; therefore, even if the border-less contact connecting manner is used, the first wiring layer 14 and the like are not bared. Accordingly, even if fluorine plasma treatment is conducted in the next step, it is possible to prevent the first wiring layer 14 containing Al from being corroded by fluorine. Furthermore, the deteriorated portions, which are formed on the regions exposed to the via holes of the second interlayer insulation film 18 in the step of exfoliating the photoresist, are subjected to a fluorine plasma treatment. This treatment makes it possible to remove water components from the deteriorated regions and generate the modified portions 18a in these regions. In the fluorine plasma treatment, the substrate is introduced into a chamber of a plasma treating machine, and then fluorine gas and fluorocarbon gas such as $CH_3F$, $C_2F_6$ or the like is introduced into the chamber at a flow of 50 to 2000 sccm, for example, to generate fluorine plasma by a parallel-plate type reactor, ICP, a helicon, ECR, microwaves, or the like.

Next, the connecting metal layer 16 and the second wiring layer 20 are formed in the same manner as in the first embodiment.

In the second embodiment thus produced, the deteriorated portions formed in the step of exfoliating the photoresist are restored into the modified portions 18a having a small amount of water components and a low dielectric constant by the fluorine plasma treatment. In the fluorine plasma treatment, the first wiring layer 14 is covered with the fluorine preventive layer 21 and the reflection preventive layer 15; therefore, fluorine plasma does not contact the wiring layer 14. For this reason, the first wiring layer 14 containing Al is not corroded.

Figure 6:
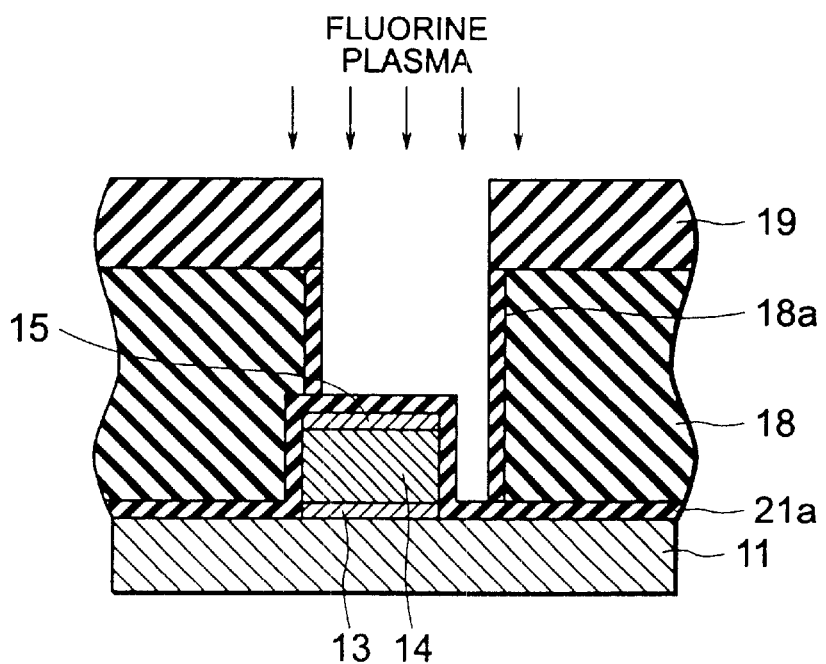
FIG. 6 is a cross section illustrating an example wherein a fluorine preventive film containing Si$_3$N$_4$ is used.

As the fluorine preventive layer, a $Si_3N_4$ film may be used instead of the TiN film. FIG. 6 is a cross section illustrating an example wherein the fluorine preventive layer containing $Si_3N_4$ is used. In the case that the $Si_3N_4$ is used as the fluorine preventive layer, the reflection preventive layer 15 is formed and subsequently the fluorine preventive layer 21a is formed on the entire surface by CVD, to have a thickness of, for example, about 50 nm. The second interlayer insulation film 18 is formed on the fluorine preventive layer 21a without forming the first interlayer insulation film. Via holes are then formed. The resultant is subjected to a fluorine plasma treatment and subsequent etching, to remove the fluorine preventive layer 21a inside the regions where vias are to be formed.

Figure 7:
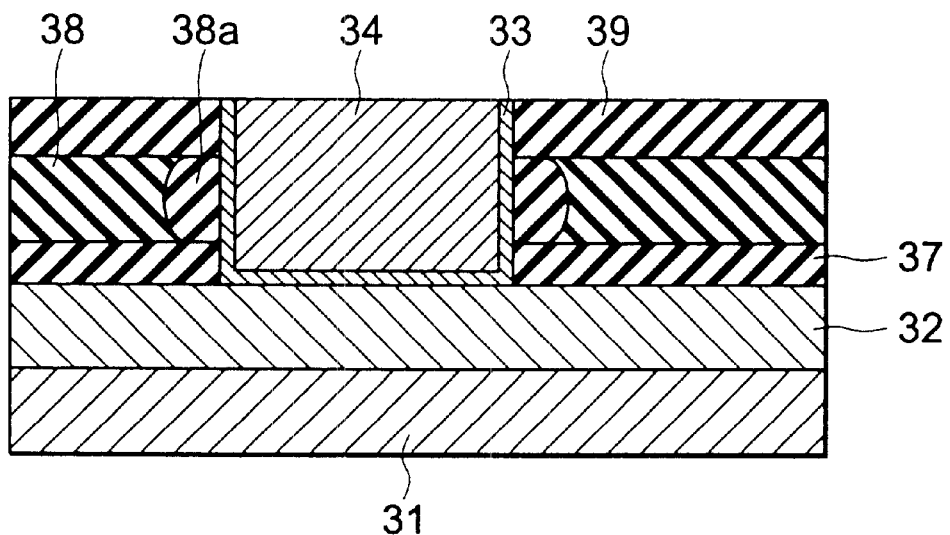
FIG. 7 is a cross section illustrating a semiconductor device according to a third embodiment of the present invention.

The following will describe a third embodiment of the present invention. FIG. 7 is a cross section illustrating a semiconductor device according to the third embodiment of the present invention.

In the third embodiment, an underlying layer 32 is formed on a silicon substrate 31. A first plasma TEOS oxide film 37 having grooves is formed on the underlying layer 32. An HSQ film 38 and a second plasma TEOS oxide film 39 are formed on the first plasma TEOS oxide film 37, in the order of the films 37, 38 and 39. Each of the films 38 and 39 has grooves at the same positions as the grooves of the first plasma TEOS oxide film 37 are present. Modified portion 38a including a large amount of Si—CH₃ bonds are formed near the grooves of the HSQ film 38. A barrier metal layer 33 is formed on the base face and the side face of the groove made in the three layers. A Cu wiring layer 34 is embedded in the region surrounded by the barrier metal layer 33.

The following will describe a process for producing the semiconductor device according to the third embodiment of the present invention. FIGS. 8A to 8E are cross sections illustrating a process for producing the semiconductor device according to the third embodiment, in the order of the steps thereof.

Figure 8A:
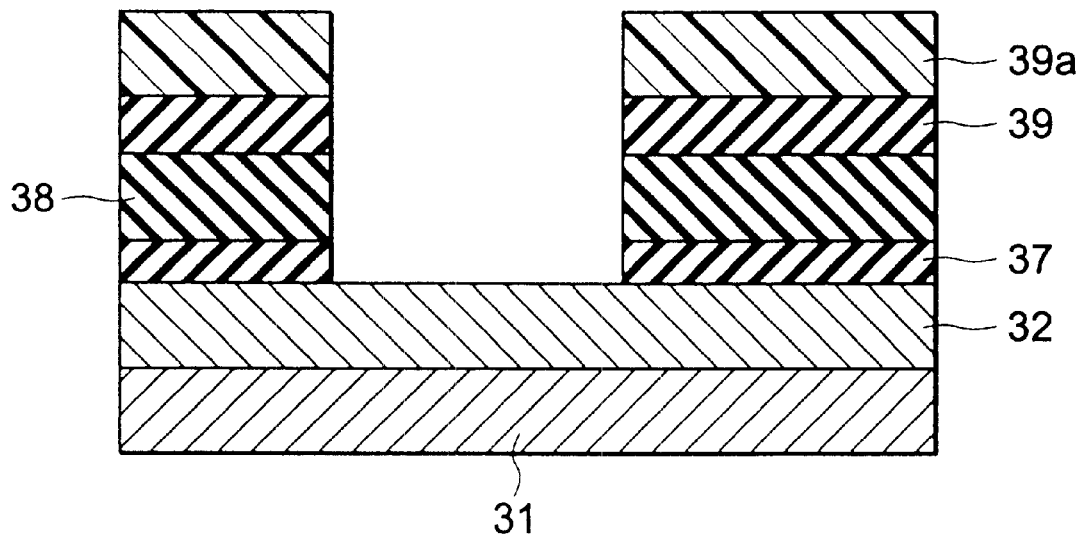
FIGS. 8A to 8E are cross sections illustrating a process for producing the semiconductor device according to the third embodiment of the present invention, in the order of the steps thereof.

As shown in FIG. 8A, elements such as transistors are first formed on the silicon substrate 31 to form the underlying layer 32. Next, the first plasma TEOS oxide film 37 is formed on the underlying layer 32, to have a thickness of, for example, about 1000 Å. Thereafter, the HSQ film 38 is applied on the first plasma TEOS oxide film 37, to have a thickness of, for example, about 500 nm. The resultant is thermally treated on a hot plate of about 200° C., and then is sintered at about 400° C. in a sintering furnace for 1 hour, for example. The second plasma TEOS oxide film 39 is formed on the HSQ film 38, to have a thickness of, for example, about 100 nm. Next, a photoresist 39a is formed on the second plasma TEOS oxide film 39. Subsequently, the photoresist 39a is patterned by exposure to light and development. Using the photoresist 39a as a mask, the second plasma TEOS oxide film 39, the HSQ film 38 and the first plasma TEOS oxide film 37 are successively patterned by fluorocarbon-based gas, to make the grooves.

Figure 8B:
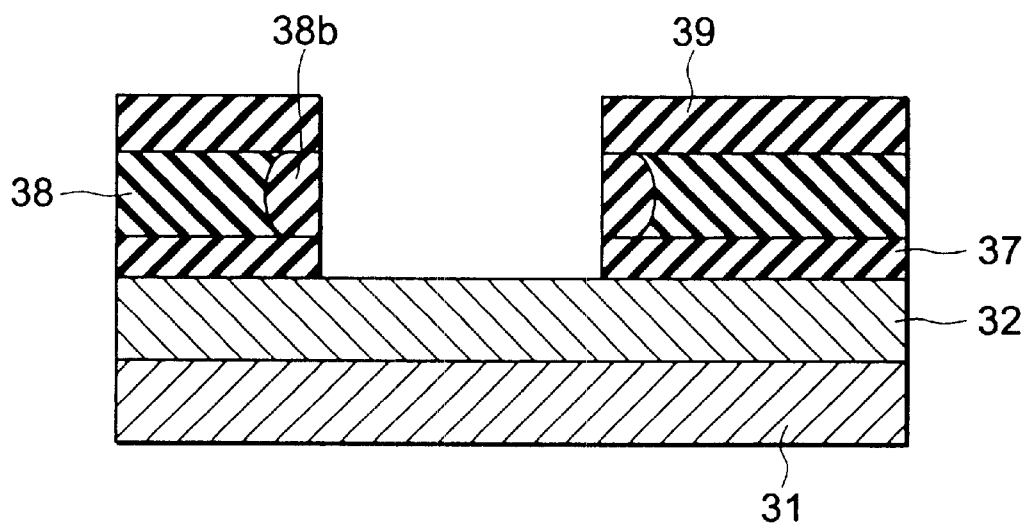

Next, as shown in FIG. 8B, the photoresist 39a is removed by ICP ashing using oxygen gas. The resultant is then subjected to a wet exfoliating treatment. The Si—H bonds in the regions exposed to the grooves of the HSQ film 38 are easily broken by the plasma treatment and the wet exfoliating treatment, to produce Si—OH bonds having moisture absorption. In this way, the deteriorated portions 38b are produced in this region.

Next, the HSQ film 38 is exposed to hexamethyldisilaxane (abbreviated to HMDS hereinafter) in a vacuum chamber for 10 minutes, for example. HMDS is represented by the following chemical formula 1.

(CH₃)₃—Si—NH—Si—(CH₃)₃     (1)

By exposing the HSQ film 38 to HMDS as described, the reaction represented by the following chemical equation 2 arises in the deteriorated portions 38b.

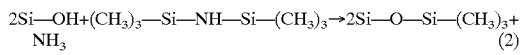
2Si—OH+(CH₃)₃—Si—NH—Si—(CH₃)₃→2Si—O—Si—(CH₃)₃+ NH₃     (2)

Figure 8C:
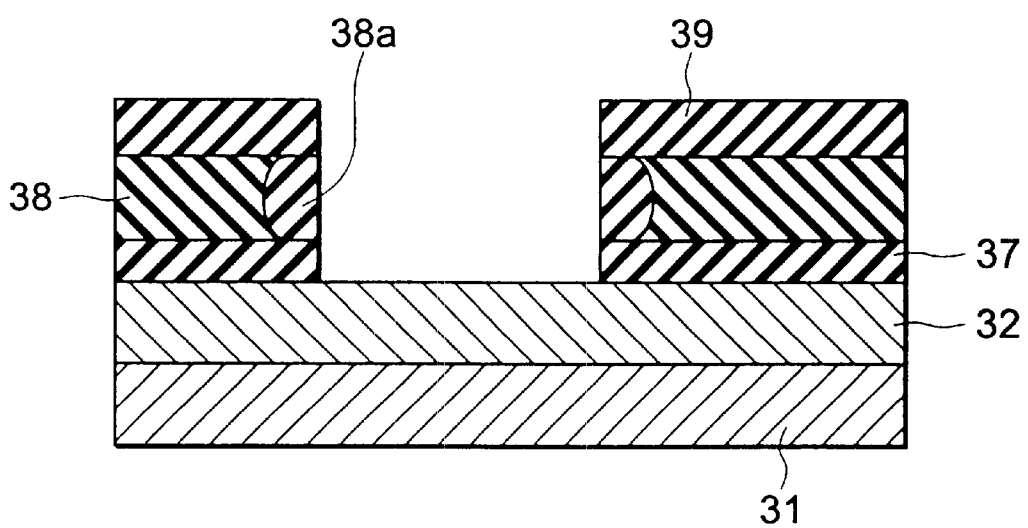

This reaction causes almost all of the Si—OH bonds to be changed into Si—CH₃ bonds. Thus, as shown in FIG. 8C, the modified portion 38a is produced in the regions where the deteriorated portion 38b was present.

Figure 8D:
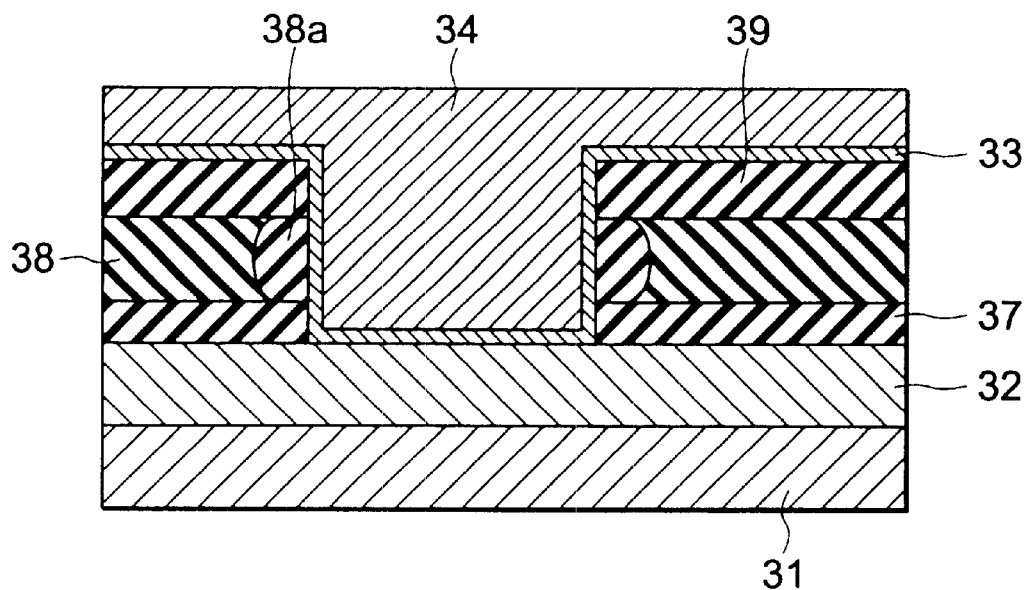

Next, as shown in FIG. 8D, a TiN film is formed on the entire surface by sputterings to have a thickness of, for example, 50 nm. In this way, the barrier metal layer 33 is formed inside the grooves. Subsequently, a Cu-CVD layer of, for example, 750 nm in thickness is formed on the entire surface by CVD while the vacuum for forming the barrier metal layer 33 is kept. Thus, the Cu wiring layer 34 is formed.

Figure 8E:
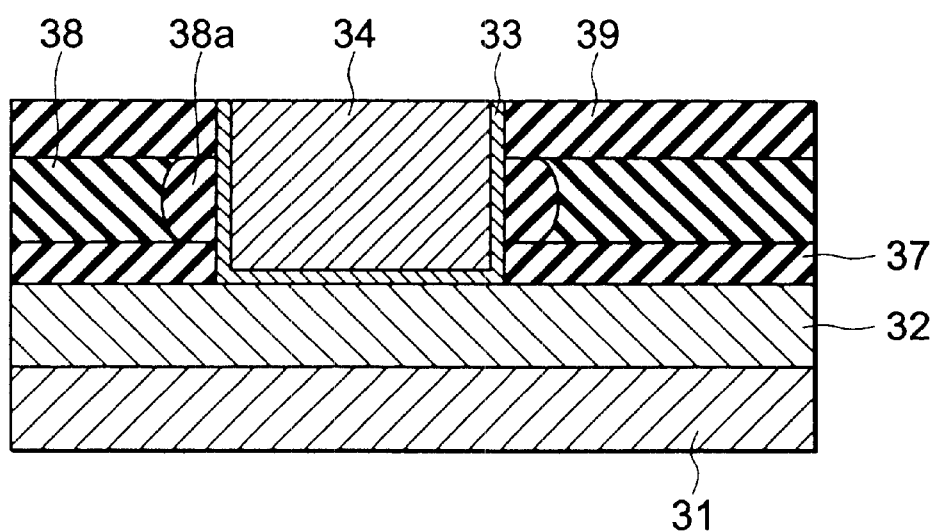

Next, as shown in FIG. 8E, the resultant is subjected to metal chemical mechanical polishing (metal CMP), to make the barrier metal layer 33 and the Cu wiring layer 34 flat.

In the third embodiment thus produced, the deteriorated portions 38b, which are regions including Si—OH bonds, are subjected to a hydrophobic treatment, that is, the treatment of the exposure to HMDS; therefore, the Si—OH bonds are changed into Si—CH₃ bonds to produce the modified portions 38a. Accordingly, it is possible to prevent inferiority in embedding in the barrier metal layer 33 and the Cu wiring layer 34, and a rise in the dielectric constant of the HSQ film 38.

In the third embodiment, the HSQ film 38 is used as the low dielectric constant film, but the same advantages are obtained in the case of using an organic SOG film. Of course, other films containing Si—H bonds and/or Si—CH₃ bonds may be used.

What is claimed is:

1. A process for producing a semiconductor device, comprising the steps of:

forming an interlayer insulation film containing a dielectric component represented by a chemical formula having a Si—H bond on a semiconductor substrate, forming a photoresist on said interlayer insulation film, patterning said photoresist into a form of a contact hole, conducting dry-etching of said interlayer insulation film by use of said photoresist as a mask, removing said photoresist, and exposing said interlayer insulation film to nitrogen plasma and hydrogen plasma.

2. The process for producing a semiconductor device according to claim 1, wherein the step of exposing said interlayer insulation film to nitrogen plasma and hydrogen plasma comprises the step of introducing nitrogen gas and hydrogen gas in a chamber in which said semiconductor substrate is arranged, and the volume of said hydrogen gas to said volume of the nitrogen gas is from 2 to 80%.

3. A process for producing a semiconductor device, comprising the steps of:

forming an interlayer insulation film containing a dielectric component represented by a chemical formula having a Si—CH₃ bond on a semiconductor substrate, forming a photoresist on said interlayer insulation film, patterning said photoresist into a form of a contact hole, conducting dry-etching of said interlayer insulation film by use of said photoresist as a mask, removing said photoresist, and exposing said interlayer insulation film to nitrogen plasma and hydrogen plasma.

4. The process for producing a semiconductor device according to claim 3, wherein the step of exposing said interlayer insulation film to nitrogen plasma and hydrogen plasma comprises the step of introducing nitrogen gas and hydrogen gas in a chamber in which said semiconductor substrate is arranged, and the volume of said hydrogen gas to said volume of the nitrogen gas is from 2 to 80%.

5. A process for producing a semiconductor device, comprising the steps of:

forming an interlayer insulation film containing a dielectric component represented by a chemical formula having a Si—H bond on a semiconductor substrate, forming a photoresist on said interlayer insulation film, patterning said photoresist into a form of a contact hole, conducting dry-etching of said interlayer insulation film by use of said photoresist as a mask, removing said photoresist, and exposing said interlayer insulation film to fluorine plasma.

6. A process for producing a semiconductor device, comprising the steps of:
  forming an interlayer insulation film containing a dielectric component represented by a chemical formula having a Si—$CH_3$ bond on a semiconductor substrate,
  forming a photoresist on said interlayer insulation film,
  patterning said photoresist into a form of a contact hole,
  conducting dry-etching of said interlayer insulation film by use of said photoresist as a mask,
  removing said photoresist, and
  exposing said interlayer insulation film to fluorine plasma.

7. A process for producing a semiconductor device, comprising the steps of:
  forming an interlayer insulation film containing a dielectric component represented by a chemical formula having a S—H bond on a semiconductor substrate,
  forming a photoresist on said interlayer insulation film,
  patterning said photoresist into a form of a contact hole,
  conducting dry-etching of said interlayer insulation film by use of said photoresist as a mask,
  removing said photoresist, and
  exposing said interlayer insulation film to hexamethyldisilaxane gas.

8. A process for producing a semiconductor device, comprising the steps of:
  forming an interlayer insulation film containing a dielectric component represented by a chemical formula having a Si—$CH_3$ bond on a semiconductor substrate,
  forming a photoresist on said interlayer insulation film,
  patterning said photoresist into a form of a contact hole,
  conducting dry-etching of said interlayer insulation film by use of said photoresist as a mask,
  removing said photoresist, and
  exposing said interlayer insulation film to hexamethyldisilaxane gas.

9. A process for producing a semiconductor device, comprising the steps of:
  forming a wiring layer selectively on a semiconductor substrate,
  forming a nitrogen film on the entire surface,
  forming an interlayer insulation film containing a dielectric component represented by a chemical formula having a Si—H bond bond on said nitrogen film,
  forming a photoresist on said interlayer insulation film,
  patterning said photoresist into a shape having an opening on said wiring layer,
  conducting dry-etching of said interlayer insulation film by use of said photoresist as a mask,
  removing said photoresist, and
  exposing said interlayer insulation film to fluorine plasma.

10. A process for producing a semiconductor device, comprising the steps of:
  forming a wiring layer selectively on a semiconductor substrate,
  forming a nitrogen film on the entire surface,
  forming an interlayer insulation film containing a dielectric component represented by a chemical formula having a Si—$CH_3$ bond on said nitrogen film,
  forming a photoresist on said interlayer insulation film,
  patterning said photoresist into a shape having an opening on said wiring layer,
  conducting dry-etching of said interlayer insulation film by use of said photoresist as a mask,
  removing said photoresist, and
  exposing said interlayer insulation film to fluorine plasma.

* * * * *

UNITED STATES PATENT AND TRADEMARK OFFICE
CERTIFICATE OF CORRECTION

PATENT NO. : 6,479,407 B2
DATED : November 12, 2002
INVENTOR(S) : Yokoyama et al.

It is certified that error appears in the above-identified patent and that said Letters Patent is hereby corrected as shown below:

Title page,
Item [57], ABSTRACT,
Line 2, "Si-E" should be -- Si-H --.

Column 11,
Line 18, "S-H" should be -- Si-H --.

Signed and Sealed this

Twenty-fourth Day of August, 2004

JON W. DUDAS
*Director of the United States Patent and Trademark Office*